United States Patent
Yamamoto et al.

(10) Patent No.: US 11,908,717 B2
(45) Date of Patent: Feb. 20, 2024

(54) TRANSFER METHOD AND TRANSFER SYSTEM FOR TRANSFERRING SUBSTRATE BETWEEN TRANSFER DEVICE AND SUBSTRATE STAGE

(71) Applicant: Tokyo Electron Limited, Tokyo (JP)

(72) Inventors: Masakazu Yamamoto, Iwate (JP); Tadashi Enomoto, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 512 days.

(21) Appl. No.: 16/883,965

(22) Filed: May 26, 2020

(65) Prior Publication Data
US 2020/0381281 A1 Dec. 3, 2020

(30) Foreign Application Priority Data
May 29, 2019 (JP) ................. 2019-100659

(51) Int. Cl.
*H01L 21/67* (2006.01)
*H01L 21/673* (2006.01)
(Continued)

(52) U.S. Cl.
CPC ...... *H01L 21/67259* (2013.01); *B25J 9/1666* (2013.01); *B25J 9/1674* (2013.01); *B25J 9/1676* (2013.01); *B25J 11/0095* (2013.01); *G01B 11/14* (2013.01); *G05B 19/4061* (2013.01); *H01L 21/67178* (2013.01); *H01L 21/67288* (2013.01);
(Continued)

(58) Field of Classification Search
CPC .......... H01L 21/67303; H01L 21/6709; H01L 21/67178; H01L 21/67259; H01L 21/67781; H01L 21/67288; B25J 9/1666; B25J 9/1674; B25J 9/1676; B25J 11/0095; G01B 11/14; G05B 2219/2602;
(Continued)

(56) References Cited

U.S. PATENT DOCUMENTS 5,944,857 A * 8/1999 Edwards ........... H01L 21/67201
29/25.01
6,042,623 A * 3/2000 Edwards ........... H01L 21/67751
414/217
(Continued)

FOREIGN PATENT DOCUMENTS

JP 2681055 B2 * 11/1997
JP 2004174669 A * 6/2004 ....... H01L 21/67167
(Continued)

*Primary Examiner* — Gordon J Stock, Jr.
(74) *Attorney, Agent, or Firm* — Venjuris, P.C.

(57) ABSTRACT

A transfer method transfers a substrate between a transfer unit configured to hold and transfer the substrate and a substrate stage serving as a transfer destination or a transfer source of the substrate. The transfer method includes: acquiring positional information of the transfer unit and positional information of the substrate stage; determining whether or not there is a risk for the substrate to contact with the substrate stage, based on the acquired positional information of the transfer unit and positional information of the substrate stage; and when determined that there is a risk for the substrate to contact with the substrate stage, notifying the risk according to the determination at the determining.

10 Claims, 6 Drawing Sheets

(51) Int. Cl.
  *H01L 21/677* (2006.01)
  *G01B 11/14* (2006.01)
  *B25J 11/00* (2006.01)
  *B25J 9/16* (2006.01)
  *G05B 19/4061* (2006.01)
(52) U.S. Cl.
  CPC .. *H01L 21/67303* (2013.01); *H01L 21/67781*
    (2013.01); *G05B 2219/40317* (2013.01); *G05B*
    *2219/40476* (2013.01)
(58) Field of Classification Search
  CPC ........... G05B 2219/45031; G05B 2219/40317;
    G05B 2219/40476; G05B 19/4061
  See application file for complete search history.

(56) References Cited

U.S. PATENT DOCUMENTS

| | | | | |
|---|---|---|---|---|
| 8,565,911 | B2 * | 10/2013 | Abe | H01L 21/67098 |
| | | | | 700/214 |
| 9,136,150 | B2 * | 9/2015 | Hayashi | H01L 21/67259 |
| 10,042,356 | B2 * | 8/2018 | Iida | G05B 19/4189 |
| 11,037,810 | B2 * | 6/2021 | Mochizuki | B25J 9/1628 |
| 11,257,699 | B2 * | 2/2022 | Miyada | H01L 21/67259 |
| 2006/0138367 | A1 * | 6/2006 | Kondoh | H01L 21/67259 |
| | | | | 250/559.12 |
| 2010/0008688 | A1 * | 1/2010 | Kimura | H01L 21/67745 |
| | | | | 399/66 |
| 2019/0355604 | A1 * | 11/2019 | Kawabe | H01L 21/67196 |
| 2019/0384182 | A1 * | 12/2019 | Takarada | G05B 19/41875 |
| 2020/0161154 | A1 * | 5/2020 | Sugita | H01L 21/67742 |
| 2020/0192324 | A1 * | 6/2020 | Asai | G05B 19/406 |
| 2021/0183628 | A1 * | 6/2021 | Sugita | H01J 37/244 |
| 2021/0252695 | A1 * | 8/2021 | Shindo | G05B 19/41815 |
| 2021/0398342 | A1 * | 12/2021 | Yamamoto | G06T 17/30 |
| 2022/0383536 | A1 * | 12/2022 | Enomoto | H01L 21/67781 |
| 2022/0388785 | A1 * | 12/2022 | Enomoto | H01L 21/67265 |

FOREIGN PATENT DOCUMENTS

| | | | | | |
|---|---|---|---|---|---|
| JP | 2007265028 | A | * | 10/2007 | ............ B25J 9/1676 |
| JP | 2009-152396 | A | | 7/2009 | |
| JP | 2010-056469 | A | | 3/2010 | |
| JP | 2011238808 | A | * | 11/2011 | ....... H01L 21/67745 |
| JP | 2012038922 | A | * | 2/2012 | ....... G05B 19/41815 |
| JP | 2019-046843 | A | | 3/2019 | |
| JP | 2020194925 | A | * | 12/2020 | .......... B25J 11/0095 |
| KR | 20110065888 | A | * | 6/2011 | |
| KR | 101258251 | B1 | * | 4/2013 | |
| KR | 20230023235 | A | * | 2/2023 | |
| TW | 201623911 | A | * | 7/2016 | .......... B25J 11/0095 |
| WO | WO-2014163010 | A1 | * | 10/2014 | ....... H01L 21/67253 |
| WO | WO-2021065576 | A1 | * | 4/2021 | ............ B65G 43/02 |

* cited by examiner

TRANSFER METHOD AND TRANSFER SYSTEM FOR TRANSFERRING SUBSTRATE BETWEEN TRANSFER DEVICE AND SUBSTRATE STAGE

CROSS-REFERENCE TO RELATED APPLICATIONS

This application is based on and claims priority from Japanese Patent Application No. 2019-100659 filed on May 29, 2019 with the Japan Patent Office, the disclosure of which is incorporated herein in its entirety by reference.

TECHNICAL FIELD

The present disclosure relates to a transfer method and a transfer system.

BACKGROUND

A vertical-type heat treatment apparatus that has a vertically extended heat treatment furnace, accommodates a wafer boat in a state where a plurality of wafers is placed therein in the heat treatment furnace, and performs a heat treatment to heat the wafers, is known (see, e.g., Japanese Patent Laid-Open Publication No. 2019-046843). In the vertical-type heat treatment apparatus, a plurality of wafers W received in a carrier is simultaneously transferred to the wafer boat by a wafer transfer device including a plurality of forks.

SUMMARY

A transfer method according to an aspect of the present disclosure is a transfer method of transferring a substrate between a transfer unit configured to hold and transfer the substrate and a substrate stage serving as a transfer destination or a transfer source of the substrate. The transfer method includes: acquiring positional information of the transfer unit and positional information of the substrate stage; determining whether or not there is a risk for the substrate to contact with the substrate stage, based on the acquired positional information of the transfer unit and positional information of the substrate stage; and when determined that there is a risk for the substrate to contact with the substrate stage, notifying the risk according to the determination at the determining.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
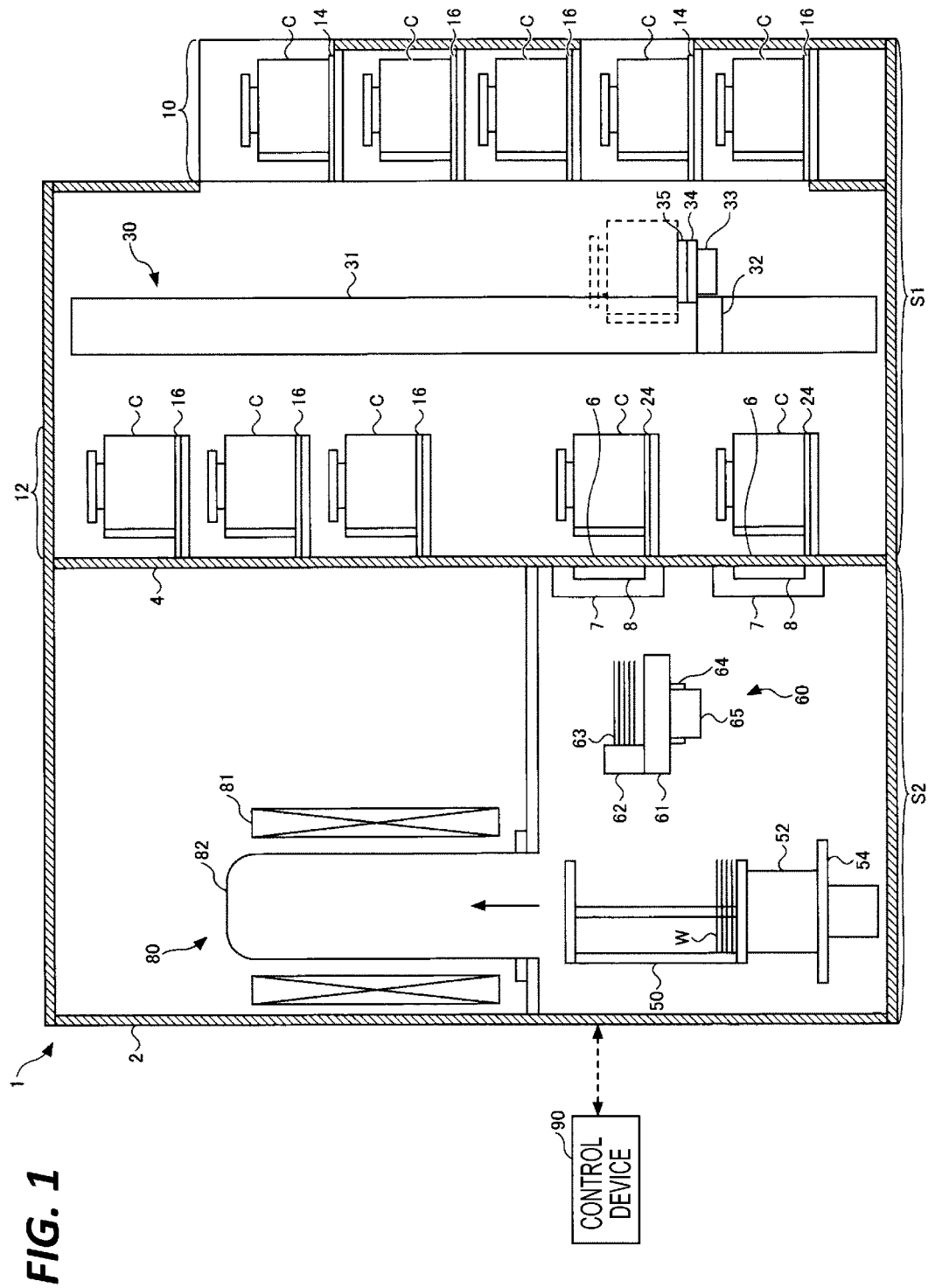
FIG. 1 is a cross-sectional view illustrating an exemplary configuration of a substrate processing system of an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[Substrate Processing System]

Figure 2:
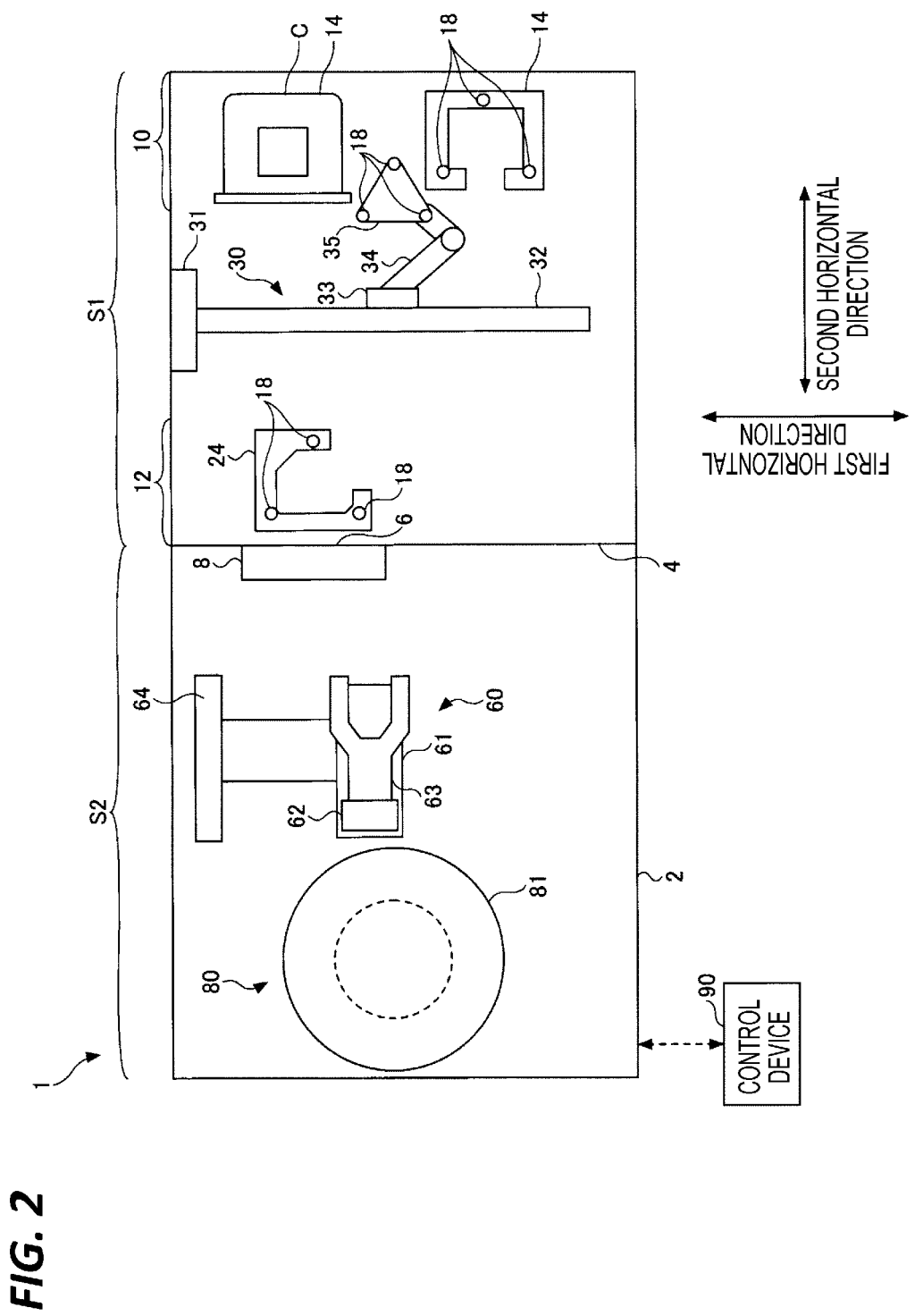
FIG. 2 is a plan view illustrating an exemplary configuration of the substrate processing system of the embodiment.

Descriptions will be made on an exemplary configuration of a substrate processing system of an embodiment with reference to FIGS. 1 and 2. FIGS. 1 and 2 are a cross-sectional view and a plan view, respectively, illustrating the exemplary configuration of the substrate processing system of the embodiment.

As illustrated in FIG. 1, the substrate processing system includes a processing apparatus 1 and a control device 90. The substrate processing apparatus 1 is an apparatus that performs a predetermined processing (e.g., heat treatment) on a semiconductor wafer (hereinafter, referred to as a "wafer W") serving as a substrate. The control device 90 is a device that performs control on the entire substrate processing apparatus 1.

[Substrate Processing Apparatus]

Descriptions will be made on an exemplary configuration of the substrate processing apparatus 1 with reference to FIGS. 1 and 2. The substrate processing apparatus 1 is configured to be accommodated in a case 2 that constitutes an exterior body of the apparatus. In the case 2, a carrier transfer section S1 and a wafer transfer section S2 are formed. The carrier transfer section S1 and the wafer transfer section S2 are partitioned by a partition wall 4. A transfer port 6 is provided on the side wall 4 to communicate the carrier transfer section S1 and the wafer transfer section S2 with each other, and transfer the wafer W. The transfer port 6 is opened/closed by a door mechanism 8 according to the front-opening interface mechanical standard (FIMS). A driving mechanism of a cover opening/closing device 7 is connected to the door mechanism 8. The door mechanism 8 is configured to be freely movable horizontally and vertically by the driving mechanism so that the transfer port 6 is opened/closed.

Hereinafter, the arrangement direction of the carrier transfer section S1 and the wafer transfer section S2 is referred to as a front-back direction (corresponding to the second horizontal direction in FIG. 2), and the horizontal direction perpendicular to the front-back direction is referred to as a left-right direction (corresponding to the first horizontal direction in FIG. 2).

The carrier transfer section S1 is a section under the atmosphere. The carrier transfer section S1 is a section where a carrier C in which the wafer W is received is transferred between components (to be described later) in the substrate processing apparatus 1, and is carried into the substrate processing apparatus 1 from the outside or carried out from the substrate processing apparatus 1 to the outside. The carrier C may be, for example, a front-opening unified pod (FOUP). By maintaining the cleanliness level in the FOUP at a predetermined level, it is possible to prevent foreign matters from adhering or a natural oxide film from being formed on the surface of the wafer W. The carrier transfer section S1 is constituted by a first transfer section 10 and a second transfer section 12 that is positioned behind the first transfer section 10 (wafer transfer section S2 side).

The first transfer section 10 is provided with load ports 14, for example, in vertical two tiers (see FIG. 1), of which each tier includes two left and right load ports 14 (FIG. 2). Each of the load ports 14 is a carry-in stage that receives the carrier C when the carrier C is carried in the substrate processing apparatus 1. Each of the load ports 14 is provided at an opened portion of the wall of the case 2 and configured to enable access to the substrate processing apparatus 1 from the outside. Specifically, carry-in and placement of the carrier C on the load port 14 and carry-out of the carrier C from the load port 14 to the outside may be performed by a transfer device (not illustrated) provided outside the substrate processing apparatus 1. Further, since the load ports 14 are provided, for example, in vertical two tiers, carry-in/out of the carrier C may be performed in two directions. A stocker 16 may be provided below each of the load ports 14 so as to store the carrier C. Positioning pins 18 that position the carrier C are provided at, for example, three portions on the surface of the load port 14 on which the carrier C is placed. Further, the load port 14 may be configured to be movable in the front-back direction in a state where the carrier C is placed on the load port 14.

In a lower portion of the second transfer section 12, two FIMS ports 24 (see FIG. 1) are disposed side by side in the vertical direction. The FIMS ports 24 are holding stages configured to hold the carrier C when the wafer W inside the carrier C is carried into/out from a heat treatment furnace 80 (to be described later) in the wafer transfer section S2. The FIMS ports 24 are configured to be freely movable in the front-back direction. Similarly to the load port 14, the positioning pins 18 that position the carrier C are also provided at three portions on the surface of the FIMS port 24 on which the carrier C is placed.

Stockers 16 are provided in an upper portion of the second transfer section 12 to store the carrier C. The stockers 16 are configured by, for example three-tier shelves, and two or more carriers C may be disposed on each of the shelves in the left-right direction. Further, the stockers 16 may be also disposed in the area of the lower portion of the second transfer section 12 where no carrier stage is disposed.

A carrier transfer mechanism 30 is provided between the first transfer section 10 and the second transfer section 12 to transfer the carrier C between the load port 14, the stocker 16, and the FIMS port 24.

The carrier transfer mechanism 30 includes a first guide 31, a second guide 32, a moving unit 33, an arm 34, and a hand 35. The first guide 31 is configured to extend in the vertical direction. The second guide 32 is configured to be connected to the first guide 31, and to extend in the left-right direction (the first horizontal direction). The moving unit 33 is configured to move in the left-right direction while being guided by the second guide 32. The arm 34 includes one joint and two arms, and is provided to the moving unit 33. The hand 35 is provided in a tip end of the arm 34. The pins 18 that position the carrier C are provided at three portions on the hand 35.

The wafer transfer section S2 is a section in which the wafer W is unloaded from the carrier C and various processings are performed thereon. The wafer transfer section S2 is under an inert gas atmosphere, for example, a nitrogen ($N_2$) gas atmosphere in order to suppress formation of an oxide film on the wafer W. The vertical heat treatment furnace 80 that is opened at the lower end as a furnace port is provided in the wafer transfer section S2.

The heat treatment furnace 80 is able to accommodate the wafer W, and includes a cylindrical processing container 82 made of quartz for performing the heat treatment of the wafer W. A cylindrical heater 81 is disposed around the processing container 82, and the heat treatment of the accommodated wafer W is performed by heating of the heater 81. A shutter (not illustrated) is provided below the processing container 82. The shutter is a door configured to cover the lower end of the heat treatment furnace 80 with a cover until the wafer boat 50 is carried out from the heat treatment furnace 80 and the subsequent wafer boat 50 is carried in. The wafer boat 50 serving as a substrate holder is placed on a cover 54 through a heat reserving cylinder 52 below the heat treatment furnace 80. In other words, the cover 54 is integrally provided with the wafer boat 50 below the wafer boat 50.

The wafer boat 50 is formed of, for example, quartz and configured to hold wafers W having a large diameter (e.g., a diameter of 300 mm or 450 mm) substantially horizontally at predetermined intervals in the vertical direction. The number of the wafers W accommodated in the wafer boat 50 is not particularly limited but may be, for example, 50 sheets to 200 sheets. The cover 54 is supported by a lifting mechanism (not illustrated), and the wafer boat 50 is carried into or out from the heat treatment furnace 80 by the lifting mechanism. A wafer transfer device 60 is provided between the wafer boat 50 and the transfer port 6.

The wafer transfer device 60 performs transfer of the wafer W between the carrier C held on the FIMS port 24 and the wafer boat 50. The wafer transfer device 60 includes a guide mechanism 61, a moving body 62, a fork 63, a lifting mechanism 64, and a rotating mechanism 65. The guide mechanism 61 has a rectangular parallelepiped shape. The guide mechanism 61 is configured to be attached to the lifting mechanism 64 that extends in the vertical direction, and to be movable in the vertical direction by the lifting mechanism 64 and to be rotatable by the rotating mechanism 65. The moving body 62 is provided to be movable back and forth along the longitudinal direction on the guide mechanism 61. The fork 63 is a transfer machine attached via the moving body 62, and a plurality of (e.g., five) forks 63 is provided. Since a plurality of wafers W may be transferred at the same time by having the plurality of forks 63, it is possible to shorten the time required to transfer the wafers W. However, one fork 63 may be provided.

The ceiling or the side wall of the wafer transfer section S2 may be provided with a filter unit (not illustrated). Examples of the filter unit may include a high efficiency particulate air filter (HEPA filter) and an ultra-low penetration air filter (ULPA filter). Clean air may be supplied to the wafer transfer section S2 by providing the filter unit.

[Control Device]

Descriptions will be made on the control device 90. The control device 90 performs control on the entire substrate processing apparatus 1. The control device 90 controls operations of various devices in the substrate processing apparatus 1 such that the heat treatment is performed according to a recipe under various processing conditions indicated in the recipe. Further, the control device 90 performs a processing (hereinafter, referred to as a "preventive maintenance processing") that informs a teaching timing of the wafer transfer device 60 (to be described later), and a processing (hereinafter, referred to as a "teaching support processing") that supports teaching of the wafer transfer device 60 by using machine learning.

Figure 3:
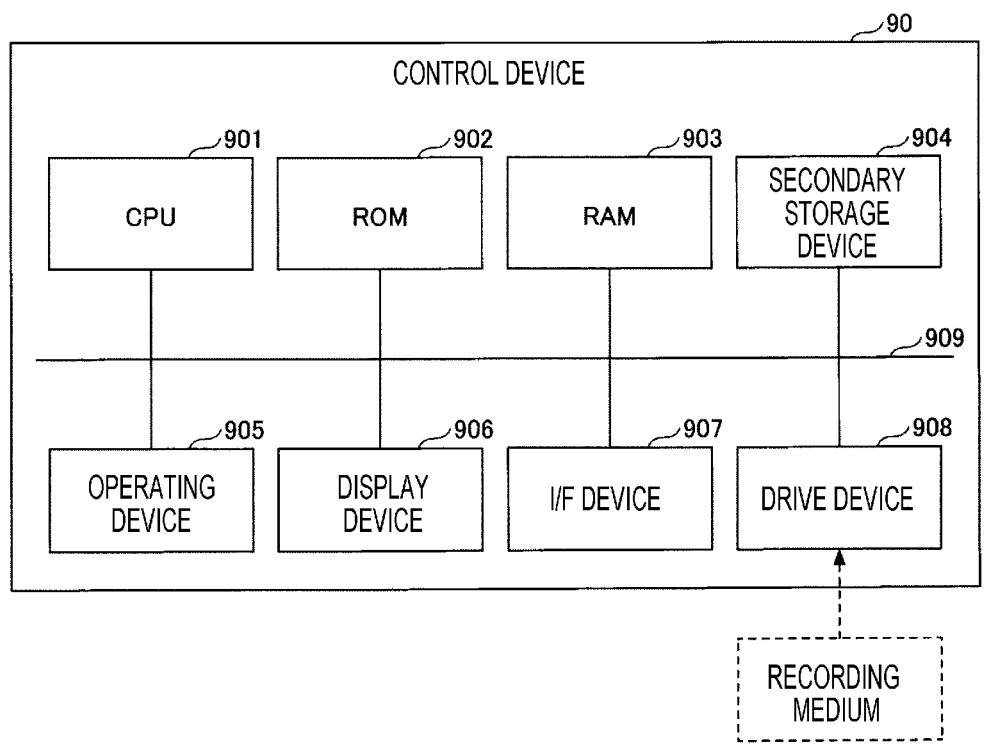
FIG. 3 is a view illustrating an example of a hardware configuration of a control device.

Descriptions will be made on an exemplary configuration of the hardware of the control device 90 with reference to FIG. 3. FIG. 3 is a view illustrating an example of a hardware configuration of the control device 90.

The control device 90 includes a central processing unit (CPU) 901, a read only memory (ROM) 902, and a random access memory (RAM) 903. The CPU 901, the ROM 902, and the RAM 903 constitute a so-called computer. Further, the control device 90 includes a secondary storage device 904, an operating device 905, a display device 906, an interface (I/F) device 907, and a drive device 908. Respective hardwares of the control device 90 are connected with each other via a bus 909.

The CPU 901 executes various programs installed in the secondary storage device 904.

The ROM 902 is a non-volatile memory, and functions as a main storage device. The ROM 902 stores, for example, various programs and data required for the CPU 901 to execute various programs installed in the secondary storage device 904.

The RAM 903 is a volatile memory such as a dynamic random access memory (DRAM) or a static random access memory (SRAM), and functions as a main storage device. The RAM 903 provides a working area developed when various programs installed in the secondary storage device 904 are executed by the CPU 901.

The secondary storage device 904 stores, for example, various programs, or teaching data acquired by executing the various programs by the CPU 901.

The operating device 905 is an input device used when an administrator inputs various instructions to the control device 90. The display device 906 displays internal information of the control device 90.

The I/F device 907 is a connection device that is connected to a communication line (not illustrated) to communicate with, for example, the substrate processing apparatus 1, and a host computer (not illustrated).

The drive device 908 is a device configured to set a recording medium. The recording medium includes a medium that records information optically, electrically, or magnetically, such as, for example, a CD-ROM, a flexible disk, and a magneto-optical disk. Further, examples of the recording medium may include a semiconductor memory that records information electrically, such as, for example, a ROM and a flash memory.

The various programs installed in the secondary storage device 904 are installed, for example, by setting the distributed recording medium in the drive device 908, and reading the various programs recorded in the recording medium by the drive device 908.

Figure 4:
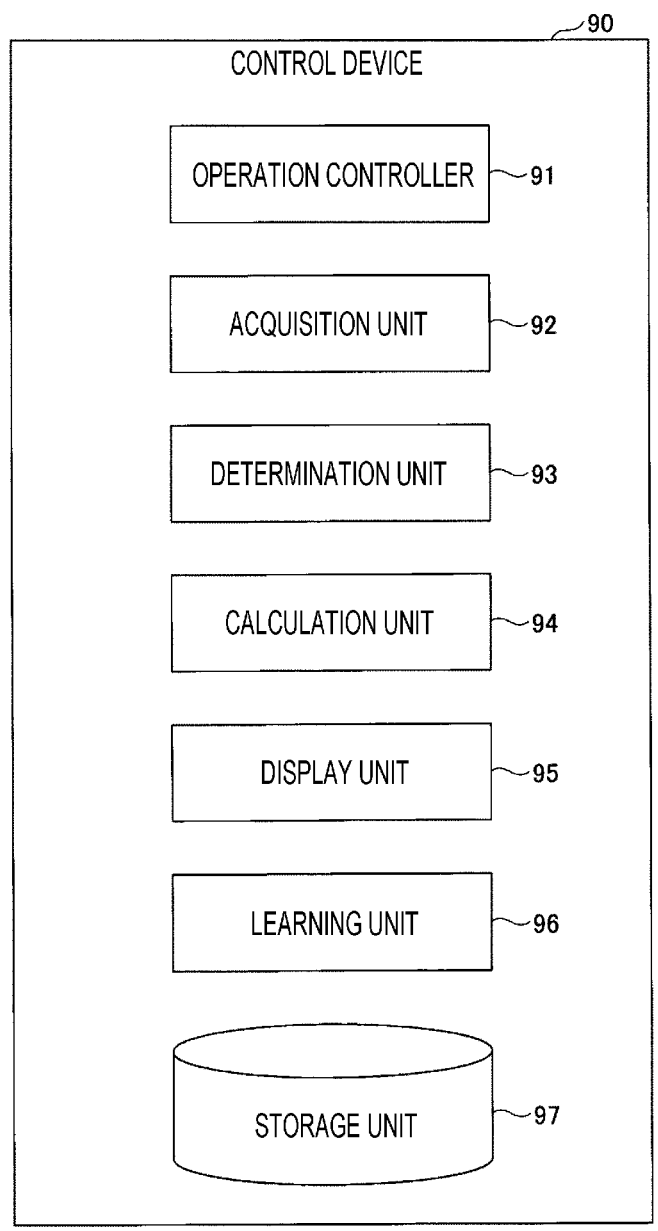
FIG. 4 is a view illustrating an example of a functional configuration of the control device.

Descriptions will be made on an exemplary functional configuration of the control device 90 with reference to FIG. 4. FIG. 4 is a view illustrating an example of a functional configuration of the control device 90.

The control device 90 includes an operation controller 91, an acquisition unit 92, a determination unit 93, a calculation unit 94, a display unit 95, a learning unit 96, and a storage unit 97.

The operation controller 91 controls an operation of each component of the substrate processing apparatus 1, for example, an operation of the wafer transfer device 60. In the embodiment, the operation controller 91 operates the wafer transfer device 60 to transfer the wafer W between the carrier C and the wafer boat 50. Further, the operation controller 91 operates the wafer transfer device 60 to execute a fork scan. The fork scan is an operation that measures positional information of the wafer transfer device 60 by, for example, an optical sensor (not illustrated). The positional information of the wafer transfer device 60 includes, for example, a fork interval that is a distance between adjacent forks of the plurality of forks 63 in the wafer transfer device 60, and a fork angle that is an angle of each fork 63 with respect to the moving body 62. The optical sensor may be, for example, a transmissive optical sensor or a reflective optical sensor provided in the wafer transfer section S2. Further, the operation controller 91 operates the wafer transfer device 60 to execute a boat scan. The boat scan is an operation that measures positional information of the wafer boat 50 by, for example, an optical sensor (not illustrated) attached to the fork 63 of the wafer transfer device 60. The positional information of the wafer boat 50 includes, for example, a wafer interval that is a distance between adjacent wafers of the plurality of wafers W held in the wafer boat 50.

The acquisition unit 92 acquires various data from the substrate processing apparatus 1. In the embodiment, the acquisition unit 92 acquires, for example, data of the fork interval measured by the fork scan and data of the wafer interval measured by the boat scan. Further, the acquisition unit 92 acquires various data stored in the storage unit 97. The various data include, for example, an x-R management chart with respect to the fork interval, an x-R management chart with respect to the difference between the wafer intervals, three-dimensional data with respect to the wafer transfer device 60, past teaching data of wafer transfer, and thermal mutation data.

The determination unit 93 performs various determinations based on the various data acquired by the acquisition unit 92. In the embodiment, the determination unit 93 determines whether or not the fork interval is within the management limit in the x-R management chart with respect to the fork interval. Further, the determination unit 93 determines whether or not the difference between the wafer interval obtained by the boat scan before the heat treatment and the wafer interval obtained by the boat scan after the heat treatment is within the management limit in the x-R management chart with respect to the difference between the wafer intervals.

The calculation unit 94 performs various calculations. In the embodiment, the calculation unit 94 corrects the teaching data of the wafer transfer device 60 based on the data of the fork interval and the data of the wafer interval acquired by the acquisition unit 92.

The display unit 95 generates various information that is displayed on the display device 906. Specifically, the display unit 95 visualizes an abnormal level. For example, the display unit 95 displays an image, in which the fork intervals acquired by the acquisition unit 92 are plotted on the x-R management chart with respect to the fork interval, on the display device 906. Further, for example, the display unit 95 displays an image, in which the wafer intervals acquired by the acquisition unit 92 are plotted on the x-R management chart with respect to the wafer interval, on the display device 906. Further, for example, the display unit 95 displays an alarm on the display device 906.

The learning unit 96 acquires the three-dimensional data with respect to the wafer transfer device 60, the past teaching data of the wafer transfer, and the thermal mutation data. Then, the learning unit 96 generates a neural network that calculates optimum teaching data for the wafer transfer for each heat treatment temperature by machine learning, based on the acquired data. The three-dimensional data with respect to the wafer transfer device 60 includes, for example, three-dimensional data of the wafer transfer device 60, the wafer boat 50, and the related peripheral devices. The past teaching data of the wafer transfer may be, for example, teaching data in which there is no record of re-teaching within a predetermined period (e.g., one year), and a defect or the like does not occur when transferring the wafer W. The thermal mutation data includes, for example, thermal mutation data of a boat elevator and the wafer transfer device 60 when carrying out the wafer boat 50 from the heat treatment furnace 80.

The storage unit 97 stores various data. Examples of the various data may include, for example, measurement data, learning data, model data, and determining data. The measurement data includes the data of the fork interval and the data of the wafer interval acquired by the acquisition unit 92. The learning data includes data required for the learning by the learning unit 96, for example, the three-dimensional data with respect to the wafer transfer device 60, the past teaching data of the wafer transfer, and the thermal mutation data. The model data includes data generated by the learning by the learning unit 96, for example, the neural network. The determining data includes data required for the determination by the determination unit 93, for example, the x-R management chart with respect to the fork interval and the x-R management chart with respect to the difference between the wafer intervals.

[Preventive Maintenance Processing]

Figure 5:
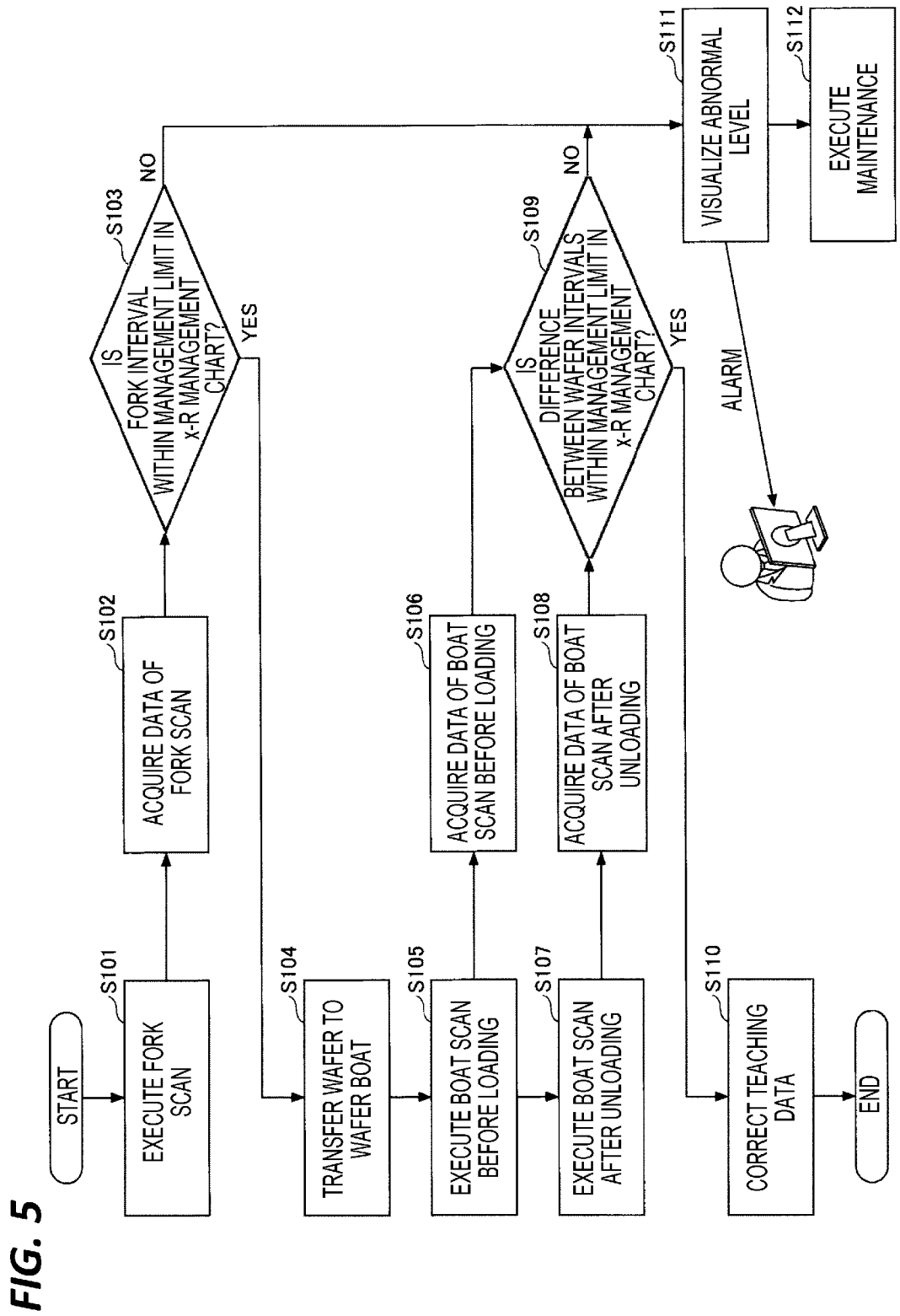
FIG. 5 is a view for explaining a flow of a preventive maintenance processing.

Descriptions will be made on a preventive maintenance processing executed by the control device 90 with reference to FIG. 5. FIG. 5 is a view for explaining a flow of the preventive maintenance processing.

In step S101, the control device 90 operates the wafer transfer device 60 to execute the fork scan. As a result, the fork interval that is the distance between the adjacent forks of the plurality of forks 63 in the wafer transfer device 60 is measured. In step S101, in addition to the fork interval, the fork angle that is the angle of each fork 63 with respect to the moving body 62 may be measured.

In step S102, the control device 90 acquires the data of the fork interval measured by the fork scan in step S101. In step S102, in addition to the data of the fork interval, the data of the fork angle may be acquired.

In step S103, the control device 90 determines whether or not the fork interval acquired in step S102 is within the management limit in the x-R management chart with respect to the fork interval, stored in the storage unit 97. The x-R management chart is created, for example, from the data acquired in advance by preliminary experiments and actual operations, and is stored in the storage unit 97. The x-R management chart is regularly updated with data of the actual operations. In step S103, when the fork interval acquired in step S102 is within the management limit in the x-R management chart with respect to the fork interval stored in the storage unit 97, it is determined that there is no risk for the wafer W to contact with the fork 63, and then, the processing proceeds to step S104. Meanwhile, in step S103, when the fork interval acquired in step S102 is not within the management limit in the x-R management chart with respect to the fork interval stored in the storage unit 97, it is determined that there is a risk for the wafer W to contact with the fork 63, and then, the processing proceeds to step S111. In step S103, in addition to the determination of the fork interval, the determination of the fork angle may be executed.

In step S104, the control device 90 operates the wafer transfer device 60 to transfer the wafer W from the carrier C serving as a transfer source to the wafer boat 50 serving as a transfer destination.

In step S105, the control device 90 executes the boat scan before carrying in (loading) the wafer boat 50 to the heat treatment furnace 80. As a result, the wafer interval before the heat treatment (loading) is measured.

In step S106, the control device 90 acquires the data of the wafer interval before loading measured by the boat scan in step S105.

In step S107, the control device 90 operates the wafer transfer device 60 to carry out (unload) the wafer boat 50 from the heat treatment furnace 80, and then, executes the boat scan. As a result, the wafer interval after the heat treatment (unloading) is measured.

In step S108, the control device 90 acquires the data of the wafer interval after unloading measured by the boat scan in step S107.

In step S109, the control device 90 determines whether or not the difference between the wafer interval obtained by the boat scan before loading and the wafer interval obtained by the boat scan after unloading is within the management limit in the x-R management chart with respect to the difference between the wafer intervals stored in the storage unit 97. In step S109, when the difference between the wafer interval acquired in step S106 and the wafer interval acquired in step S108 is within the management limit in the x-R management chart with respect to the wafer interval, it is determined that there is no risk for the wafer W to contact with the fork 63. Then, the processing proceeds to step S110. Meanwhile, in step S109, when the difference between the wafer interval acquired in step S106 and the wafer interval acquired in step S108 is not within the management limit in the x-R management chart with respect to the wafer interval, it is determined that there is a risk for the wafer W to contact with the fork 63. Then, the processing proceeds to step S111.

In step S110, the control device 90 corrects the teaching data of the wafer transfer device 60 based on the data of the fork interval acquired in step S102 and the data of the wafer interval acquired in step S108. Then, the processing ends.

In step S111, the control device 90 visualizes the abnormal level. For example, the control device 90 displays an image, in which the fork intervals acquired in step S102 are plotted on the x-R management chart with respect to the fork interval, on the display device 906. Further, for example, the control device 90 displays an image, in which the wafer intervals acquired in step S106 or in step S108 are plotted on the x-R management chart with respect to the wafer interval, on the display device 906. Further, for example, the control device 90 may have an automatic alarm function of displaying an alarm on the display device 906 to notify the alarm. With the visualization of the abnormal level and the automatic alarm function, it is possible to improve the operation rate of the apparatus by proper preventive maintenance of the apparatus and regularly adjustment by maintenance personnel.

In step S112, the maintenance personnel sets up a maintenance plan such as inspection, repair, and part replacement based on the image or the alarm displayed on the display device 906, and executes the maintenance.

According to the preventive maintenance processing described above, it is possible to improve the operation rate of the apparatus by proper preventive maintenance of the apparatus and regularly adjustment by maintenance personnel.

In the above described preventive maintenance processing, descriptions have been made on a form in which the processing proceeds to step S111 when the acquired data is not in the management limit in the x-R management chart in step S103 and step S109, but the present disclosure is not limited thereto. For example, in step S103 and step S109, when the acquired data is not in the management limit in the x-R management chart, selection may be made to proceed to step S111. Alternatively, even if the acquired data is out of the management limit, selection may be made to proceed to step S110 such that the operation is continued by performing automatic correction to an appropriate position.

Further, in the above described preventive maintenance processing, a case where the step of determining whether the data of the fork interval is included in a predetermined management limit, and the step of determining whether the data of the wafer interval is included in a predetermined management limit are included is described, but the present disclosure is not limited thereto. For example, the control device 90 may calculate the relative position of the fork 63 and the wafer boat 50 when the fork 63 is moved to a position where the wafer W is delivered between the fork 63 and the wafer boat 50, based on the data of the fork interval and the data of the wafer interval. In this case, the control device 90 determines whether or not there is a risk for the wafer W to contact with the wafer boat 50, based on the calculated relative position.

[Teaching Support Processing]

Figure 6:
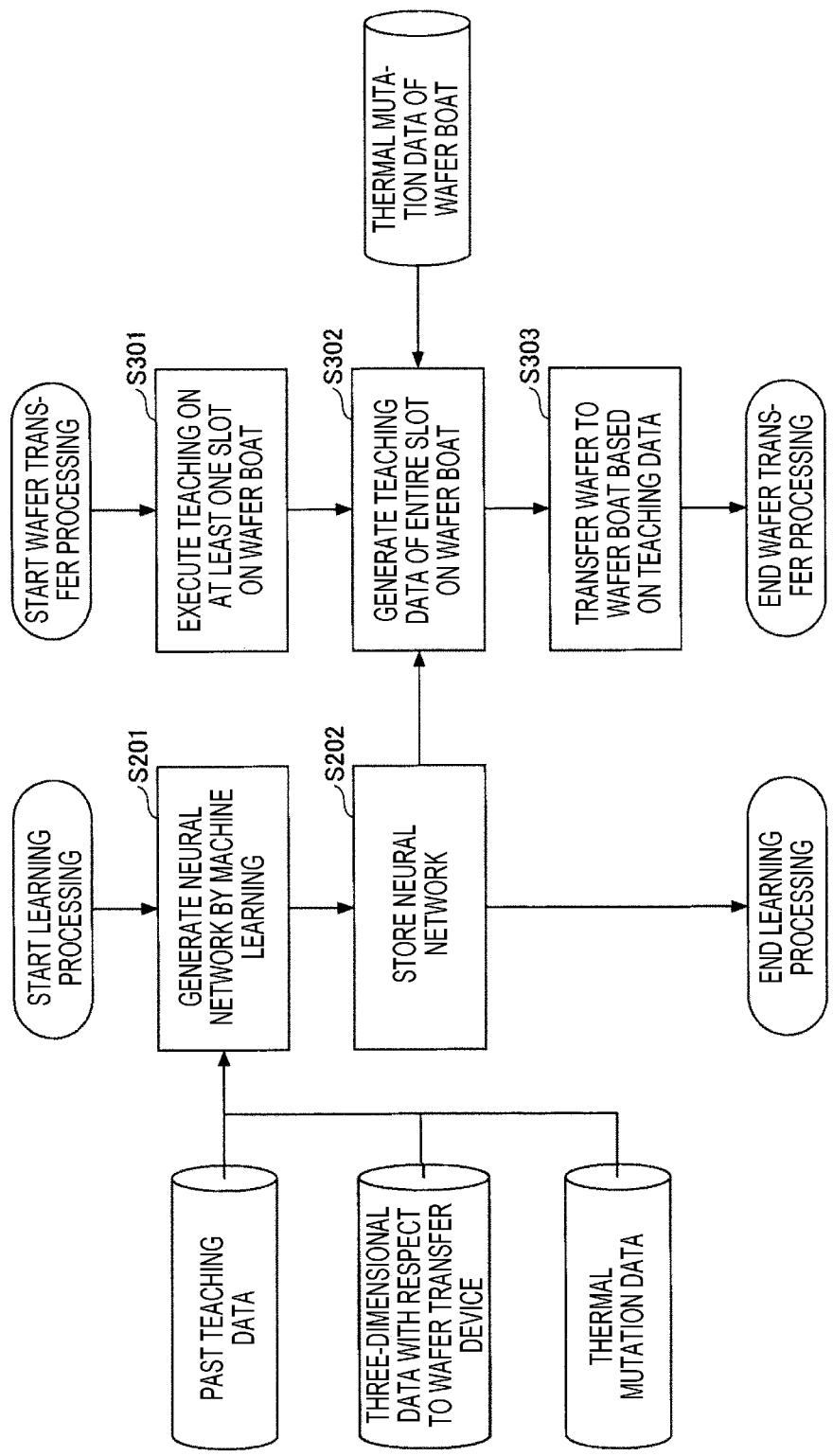
FIG. 6 is a view for explaining a flow of a teaching support processing.

Descriptions will be made on a teaching support processing executed by the control device 90 with reference to FIG. 6. FIG. 6 is a view for explaining a flow of the teaching support processing. As illustrated in FIG. 6, the teaching support processing includes a learning processing including step S201 and step S202, and a wafer transfer processing including step S301 to step S303.

In step S201, the control device 90 acquires the three-dimensional data with respect to the wafer transfer device 60, the past teaching data of the wafer transfer, and the thermal mutation data. Then, the control device 90 generates a neural network that calculates optimum teaching data for the wafer transfer for each heat treatment temperature or a form of the wafer boat 50 by machine learning, based on the acquired data. The three-dimensional data with respect to the wafer transfer device 60 includes, for example, three-dimensional data of the wafer transfer device 60, the wafer boat 50, and the related peripheral devices. The past teaching data of the wafer transfer may be, for example, teaching data in which there is no record of re-teaching within a predetermined period (e.g., one year), and a defect or the like does not occur when transferring the wafer W. The thermal mutation data includes, for example, thermal mutation data of a boat elevator and the wafer transfer device 60 when carrying out the wafer boat 50 from the heat treatment furnace 80.

In step S202, the control device 90 stores the neural network generated in step S201 in the storage unit 97, and ends the processing.

In step S301, maintenance personnel (an operator) operates the wafer transfer device 60 to execute teaching on at least one slot on the wafer boat 50, and stores the teaching data in the storage unit 97. The slot may be any slot on the wafer boat 50, and, for example, in the bottom, the top, and the periphery of the center on the wafer boat 50.

In step S302, the control device 90 generates teaching data of the entire slot based on the teaching data of at least one slot on the wafer boat 50, the neural network, and the thermal mutation data of the wafer boat 50 stored in the storage unit 97.

In step S303, the control device 90 operates the wafer transfer device 60 to transfer the wafer W to the wafer boat 50, based on the teaching data generated in step S302.

In the above embodiment, the carrier C and the wafer boat 50 are an example of the substrate stage, and the wafer transfer device 60 is an example of the transfer unit, and the fork 63 is an example of the holding unit.

According to the teaching support processing described above, since the maintenance personnel executes teaching on one portion on the wafer boat 50, it is possible to reduce the work load and variation in teaching accuracy due to differences in operators. As a result, it is possible to achieve quality and to reduce a labor cost and a delivery period.

According to the present disclosure, it is possible to predict in advance a breakage of a substrate when transferring the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A transfer method comprising:
    providing a substrate stage including a plurality of holders configured to hold a plurality of substrates and serving as a transfer destination or a transfer source of the plurality of substrates;
    providing a transfer device including a plurality of forks configured to hold and transfer the plurality of substrates to and from the substrate stage;
    acquiring positional information of the transfer device and positional information of the substrate stage;
    calculating a relative position of the transfer device and the substrate stage when the transfer device is moved to a position where the plurality of substrates is delivered between the transfer device and the substrate stage, based on the positional information of the transfer device and the positional information of the substrate stage acquired in the acquiring;
    determining whether there is a risk for an abnormal contact causing a breakage of a substrate when the plurality of substrates are delivered between the transfer device and the substrate stage, based on the relative position calculated in the calculating; and
    when determined that there is a risk for the abnormal contact, displaying the risk for the abnormal contact on a display to notify a user of the risk for the abnormal contact according to the determination at the determining.

2. The transfer method according to claim 1, wherein the determining includes:
    determining whether the positional information of the transfer device falls within a predetermined range; and
    determining whether the positional information of the substrate stage falls within a predetermined range.

3. The transfer method according to claim 1, wherein the positional information of the substrate stage includes a value measured by an optical sensor.

4. The transfer method according to claim 1, wherein the plurality of holders are configured to substantially horizontally hold the plurality of substrates at predetermined intervals in a vertical direction, and
    the positional information of the substrate stage includes a distance between adjacent holders.

5. The transfer method according to claim 1, wherein the plurality of forks are configured to hold the plurality of substrates provided at intervals in the vertical direction, and
    the positional information of the transfer device includes a distance between adjacent forks.

6. The transfer method according to claim 1, wherein the positional information of the transfer device includes a value measured by an optical sensor.

7. The transfer method according to claim 6, wherein the positional information of the substrate stage includes a value measured by an optical sensor.

8. The transfer method according to claim 7, wherein the plurality of holders are configured to substantially horizontally hold the plurality of substrates at predetermined intervals in a vertical direction, and
    the positional information of the substrate stage includes a distance between adjacent holders.

9. The transfer method according to claim 8, wherein the plurality of forks are configured to hold the plurality of substrates provided at intervals in the vertical direction, and
    the positional information of the transfer device includes a distance between adjacent forks.

10. A transfer system comprising:
a transfer device including a fork configured to hold and transfer a substrate;
a substrate stage serving as a transfer destination or a transfer source of the substrate; and
a controller configured to:
    acquire positional information of the transfer device and positional information of the substrate stage;
    determine whether there is a risk for the substrate to contact with the substrate stage, based on the positional information of the transfer device and positional information of the substrate stage; and
    display a determination result whether there is a risk for the substrate to contact with the substrate stage.

* * * * *